United States Patent
Shimobe et al.

(10) Patent No.: US 10,259,976 B2
(45) Date of Patent: Apr. 16, 2019

(54) PASTE-LIKE ADHESIVE COMPOSITION, SEMICONDUCTOR DEVICE, METHOD FOR MANUFACTURING SEMICONDUCTOR DEVICE, AND METHOD FOR BONDING HEATSINK

(71) Applicant: SUMITOMO BAKELITE CO., LTD., Tokyo (JP)

(72) Inventors: Yasuo Shimobe, Tokyo (JP); Ryuichi Murayama, Tokyo (JP); Koji Makihara, Tokyo (JP)

(73) Assignee: Sumitomo Bakelite Co., Ltd., Tokyo (JP)

( * ) Notice: Subject to any disclaimer, the term of this patent is extended or adjusted under 35 U.S.C. 154(b) by 0 days.

(21) Appl. No.: 15/546,147

(22) PCT Filed: Jan. 27, 2016

(86) PCT No.: PCT/JP2016/052295
§ 371 (c)(1),
(2) Date: Jul. 25, 2017

(87) PCT Pub. No.: WO2016/121806
PCT Pub. Date: Aug. 4, 2016

(65) Prior Publication Data
US 2018/0340101 A1 Nov. 29, 2018

(30) Foreign Application Priority Data
Jan. 29, 2015 (JP) .................................. 2015-015599

(51) Int. Cl.
*H01B 1/16* (2006.01)
*C09J 9/02* (2006.01)
(Continued)

(52) U.S. Cl.
CPC ................. *C09J 9/02* (2013.01); *C09J 11/04* (2013.01); *C09J 133/04* (2013.01); *C09J 163/00* (2013.01);
(Continued)

(58) Field of Classification Search
CPC . C09J 9/02; C09J 201/00; C09J 163/00; C09J 133/04; C09J 11/04; C09J 2203/326;
(Continued)

(56) References Cited

U.S. PATENT DOCUMENTS

2004/0000712 A1* 1/2004 Wilson ................... C08G 59/54
257/712
2008/0064141 A1* 3/2008 Misumi ............... H01L 25/0657
438/109

FOREIGN PATENT DOCUMENTS

EP 2 717 302 A1 4/2014
JP 11-61086 A 3/1999
(Continued)

OTHER PUBLICATIONS

International Search Report, issued in PCT/JP2016/052295, PCT/ISA/210, dated Apr. 19, 2016.
(Continued)

*Primary Examiner* — Mark Kopec
*Assistant Examiner* — Jaison P Thomas
(74) *Attorney, Agent, or Firm* — Birch, Stewart, Kolasch & Birch, LLP

(57) ABSTRACT

A paste-like adhesive composition of the present invention contains metal particles (A) and a thermally polymerizable compound (B), in which the metal particles (A) form a particle coupling structure by causing sintering through a thermal treatment; when dynamic viscoelasticity of the composition is measured under a condition of a measurement frequency of 1 Hz, within a temperature region of 140°
(Continued)

C. to 180° C., the composition has a temperature width of equal to or larger than 10° C. in which a shear modulus of elasticity is equal to or higher than 5,000 Pa and equal to or lower than 100,000 Pa; and an acetone insoluble fraction of a sample, which is obtained by removing the metal particles (A) and then heating the composition under conditions of 180° C. and 2 hours, is equal to or lower than 5% by weight.

21 Claims, 1 Drawing Sheet

(51) Int. Cl.
  *C09J 11/04*   (2006.01)
  *C09J 163/00*   (2006.01)
  *C09J 201/00*   (2006.01)
  *H01L 21/52*   (2006.01)
  *C09J 133/04*   (2006.01)
  *H01L 23/00*   (2006.01)

(52) U.S. Cl.
  CPC .............. *C09J 201/00* (2013.01); *H01B 1/16* (2013.01); *H01L 21/52* (2013.01); *H01L 24/07* (2013.01); *C09J 2203/326* (2013.01); *C09J 2205/102* (2013.01); *H01L 2224/32225* (2013.01); *H01L 2224/32245* (2013.01); *H01L 2224/48091* (2013.01); *H01L 2224/48227* (2013.01); *H01L 2224/48247* (2013.01); *H01L 2224/73265* (2013.01); *H01L 2924/15311* (2013.01); *H01L 2924/181* (2013.01)

(58) Field of Classification Search
  CPC .... C09J 2205/102; H01L 24/07; H01L 21/52; H01L 2224/73265; H01L 2224/48247; H01L 2924/00; H01L 2224/32225; H01L 2224/32245; H01L 2224/48091; H01L 2224/48227; H01L 2924/181; H01L 2924/00012; H01L 2924/00014; H01L 2924/15311; H01B 1/16
  See application file for complete search history.

(56) References Cited

FOREIGN PATENT DOCUMENTS

| | | |
|---|---|---|
| JP | 2000-239616 A | 9/2000 |
| JP | 2001-257219 A | 9/2001 |
| JP | 2002-12738 A | 1/2002 |
| JP | 2011-32364 A | 2/2011 |
| JP | 2013-149596 A | 8/2013 |
| JP | 2014-74132 A | 4/2014 |
| JP | 2014-194013 A | 10/2014 |

OTHER PUBLICATIONS

Written Opinion of the International Searching Authority, issued in PCT/JP2016/052295, PCT/ISA/237, dated Apr. 19, 2016.

* cited by examiner

PASTE-LIKE ADHESIVE COMPOSITION, SEMICONDUCTOR DEVICE, METHOD FOR MANUFACTURING SEMICONDUCTOR DEVICE, AND METHOD FOR BONDING HEATSINK

TECHNICAL FIELD

The present invention relates to a paste-like adhesive composition, a semiconductor device, a method for manufacturing a semiconductor device, and a method for bonding a heatsink.

BACKGROUND ART

As a resin composition for preparing a paste-like adhesive composition, for example, a resin composition containing metal particles is used in some cases. Examples of techniques relating to the paste include the technique described in Patent Document 1. Patent Document 1 describes a thermosetting resin composition containing (A) plate-type silver fine particles, (B) silver powder having a mean particle size of 0.5 to 30 μm, and (C) thermosetting resin.

RELATED DOCUMENT

Patent Document

[Patent Document 1] Japanese Laid-open Patent Publication No. 2014-194013

SUMMARY OF THE INVENTION

Technical Problem

From the viewpoint of improving thermal conductivity in a case where an adhesive layer is prepared using a paste-like adhesive composition containing metal particles, the inventor of the present invention conducted an examination regarding an operation of causing sintering of the metal particles. However, in this case, there was apprehension that it would be difficult for the sintering to uniformly proceed in the central portion and the peripheral portion of the adhesive layer in the surface direction. In a case where a large-area adhesive layer is formed, the aforementioned problem will become particularly serious.

Solution to Problem

According to the present invention, there is provided a paste-like adhesive composition containing metal particles (A) and a thermally polymerizable compound (B), in which the metal particles (A) form a particle coupling structure by causing sintering through a thermal treatment; when dynamic viscoelasticity of the composition is measured under a condition of a measurement frequency of 1 Hz, within a temperature region of 140° C. to 180° C., the composition has a temperature width of equal to or larger than 10° C. in which a shear modulus of elasticity is equal to or higher than 5,000 Pa and equal to or lower than 100,000 Pa; and an acetone insoluble fraction of a sample, which is obtained by removing the metal particles (A) and then heating the composition under conditions of 180° C. and 2 hours, is equal to or lower than 5% by weight.

According to the present invention, there is also provided a semiconductor device including a substrate and a semiconductor element mounted on the substrate through an adhesive layer obtained by performing a thermal treatment on the paste-like adhesive composition.

According to the present invention, there is also provided a method for manufacturing a semiconductor device, including a step of mounting a semiconductor element on a substrate through the paste-like adhesive composition, and a step of heating the paste-like adhesive composition.

According to the present invention, there is also provided a method for bonding a heatsink, comprising a step of bonding a heatsink to a semiconductor device through the paste-like adhesive composition, and a step of heating the paste-like adhesive composition.

Advantageous Effects of Invention

According to the present invention, it is possible to improve the sintering uniformity of the metal particles in the central portion and the peripheral portion of the adhesive layer in the surface direction.

BRIEF DESCRIPTION OF THE DRAWINGS

The aforementioned object, other objects, characteristics, and advantageous are further clarified by suitable embodiments described below and the following drawings attached thereto.

DESCRIPTION OF EMBODIMENTS

Figure 1:
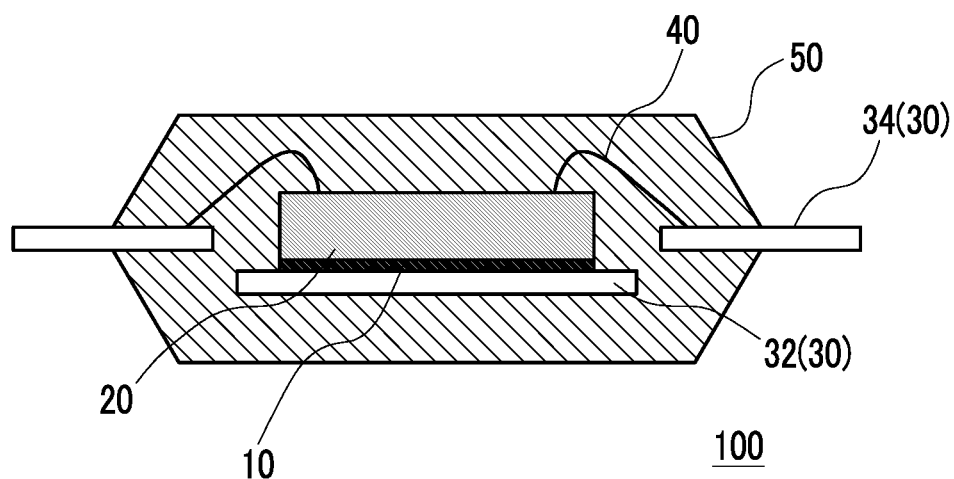
FIG. 1 is a cross-sectional view showing a semiconductor device according to the present embodiment.

Hereinafter, embodiments will be described using drawings. In all the drawings, the same constituents are marked with the same reference signs such that the description thereof will not be repeated.

In the present specification, unless otherwise specified, "to" means equal to or greater than the number listed before "to" and equal to or less than the number listed after "to".

The paste-like adhesive composition according to the present embodiment contains metal particles (A) and a thermally polymerizable compound (B). In the paste-like adhesive composition, the metal particles (A) form a particle coupling structure by causing sintering through a thermal treatment. Furthermore, when dynamic viscoelasticity of the paste-like adhesive composition is measured under a condition of a measurement frequency of 1 Hz, within a temperature region of 140° C. to 180° C., the composition has a temperature width of equal to or larger than 10° C. in which a shear modulus of elasticity is equal to or higher than 5,000 Pa and equal to or lower than 100,000 Pa. In addition, an acetone insoluble fraction of a sample, which is obtained by removing the metal particles (A) and then heating the paste-like adhesive composition under conditions of 180° C. and 2 hours, is equal to or lower than 5% by weight.

As described above, in a case where an adhesive layer is prepared by sintering metal particles contained in a paste-like adhesive composition, sometimes it is difficult for the sintering to uniformly proceed in the central portion and the peripheral portion of the adhesive layer in a surface direction. Furthermore, for example, in a case where a large-area adhesive layer is formed as a die-attach layer for bonding a large-area semiconductor element having a length of equal to or greater than 5 mm on one side, there is apprehension that the extent of proceeding of sintering will more markedly vary between the central portion and the peripheral portion of the adhesive layer. Considering the above problem, the inventor of the present invention conducted an examination regarding a paste-like adhesive composition which makes it possible to improve the sintering uniformity in the central portion and the peripheral portion of the adhesive layer in the surface direction.

As a result of a thorough examination, the inventor of the present invention obtained new knowledge that by incorporating the metal particles (A) and the thermally polymerizable compound (B) into a paste-like adhesive composition and controlling a viscoelastic behavior of the paste-like adhesive composition and an acetone insoluble fraction measured under predetermined conditions as described above, the sintering uniformity of the metal particles (A) can be improved. The paste-like adhesive composition according to the present embodiment is realized based on the new knowledge described above. Therefore, according to the present embodiment, it is possible to improve the sintering uniformity of the metal particles in the central portion and the peripheral portion of the adhesive layer in the surface direction.

Hereinafter, the paste-like adhesive composition, the semiconductor device, and the method for manufacturing the semiconductor device according to the present embodiment will be specifically described.

First, the paste-like adhesive composition will be described.

The paste-like adhesive composition according to the present embodiment contains the metal particles (A) and the thermally polymerizable compound (B). The paste-like adhesive composition according to the present embodiment is die-attach paste used for forming a die-attach layer for bonding, a semiconductor element to other structures, for example. The aforementioned other structures are not particularly limited, and examples thereof include a substrate such as a wiring board or a lead frame, a semiconductor element, a heatsink, a magnetic shield, and the like. The paste-like adhesive composition can also be used for forming an adhesive layer for bonding a heatsink to other structures described above, for example. It is preferable that the aforementioned other structures include a coat of silver or the like, which promotes the bonding of the paste of the present invention at the time of sintering, in a portion that the paste-like adhesive composition of the present invention contacts.

When dynamic viscoelasticity of the paste-like adhesive composition of the present embodiment is measured under a condition of a measurement frequency of 1 Hz, within a temperature region of 140° C. to 180° C., the composition has a temperature width W of equal to or larger than 10° C. in which a shear modulus of elasticity is equal to or higher than 5,000 Pa and equal to or lower than 100,000 Pa. In a case where the composition has the temperature width W, as described above, it is possible to improve the sintering uniformity of the metal particles (A) in the central portion and the peripheral portion of the adhesive layer in the surface direction. Particularly, by using such a paste-like adhesive composition and causing the sintering of the metal particles (A) to proceed by a thermal treatment under a low-temperature condition of lower than 200° C. as will be described later, the sintering of the metal particles (A) can more uniformly proceed in the central portion and the peripheral portion of the adhesive layer in the surface direction.

In a case where the sintering of the metal particles contained in the paste-like adhesive composition is performed under a high-temperature condition, there is apprehension that the extent of proceeding of sintering will vary between the central portion and the peripheral portion of the adhesive layer. However, so far, in some cases, it has been difficult for the sintering of the metal particles to uniformly and sufficiently proceed by a thermal treatment performed under a low-temperature condition. It is considered that this is because the sintering of the metal particles is hindered by other components contained in the paste-like adhesive composition with the thermal treatment performed under a low-temperature condition.

According to the present embodiment, when dynamic viscoelasticity of the paste-like adhesive composition is measured, within a temperature region of 140° C. to 180° C., the composition has the temperature width W of equal to or larger than 10° C. in which a shear modulus of elasticity is equal to or higher than 5,000 Pa and equal to or lower than 100,000 Pa. In a case where the composition has the temperature width W, when the sintering proceeds, it is easy for the metal particles (A) to push aside other components and contact each other. Therefore, even in a case where the sintering of the metal particles (A) is allowed to proceed by a thermal treatment performed a low-temperature condition of lower than 200° C. for example, the sintering of the metal particles (A) is not hindered, and it is possible to obtain a certain temperature region in which the viscoelasticity of the paste-like adhesive composition is adjusted such that the uniform dispersibility of the metal particles (A) can be maintained. It is considered that for this reason, although this is not an undoubted reason, the sintering of the metal particles (A) can uniformly proceed in the central portion and the peripheral portion of the adhesive layer in the surface direction.

In the present embodiment, from the viewpoint of improving the sintering uniformity, the temperature width W is more preferably equal to or larger than 15° C., particularly preferably equal to or larger than 20° C., and even more preferably equal to or larger than 25° C. The upper limit of the temperature width W is not particularly limited, and can be set to be equal to or smaller than 40° C. From the viewpoint of the productivity of a semiconductor device, the upper limit of the temperature width W is more preferably equal to or smaller than 35° C. By controlling the upper limit and the lower limit of the temperature width as described above, it is possible to more suitably form a coupling structure of conductive metal particles having high thermal conductivity.

In the present embodiment, the dynamic viscoelasticity of the paste-like adhesive composition can be measured using, for example, a rheometer (HAAKE RheoWin, manufactured by Thermo Fisher Scientific) under conditions of a measurement frequency of 1 Hz, a heating rate of 5° C./min, and a range of measurement temperature of 25° C. to 250° C.

The viscoelastic behavior of the paste-like adhesive composition having the aforementioned temperature width W can be controlled by adjusting the type or the formulation ratio of components contained in the paste-like adhesive composition for example. In the present embodiment, the type or the formulation ratio of the thermally polymerizable compound (B) is particularly important. Furthermore, it is considered that in addition to the metal particles (A) or the compound (B), for example, the adjustment of the type or the formulation ratio of a curing agent (C) or the like can be a factor affecting the temperature width W. Presumably, in order to control the temperature width W within a desired range, it is extremely important to appropriately select the type or the formulation ratio of each of the above components such that a paste-like adhesive composition is constituted in which the compound (B) can be linearly polymerized when being subjected to a thermal treatment.

In the paste-like adhesive composition according to the present embodiment, an acetone insoluble fraction of a sample, which is obtained by removing the metal particles (A) and then heating the composition under conditions of 180° C. and 2 hours, is equal to or lower than 5% by weight. In a case where the acetone insoluble fraction is equal to or lower than 5% by weight, as described above, it is possible to improve the sintering uniformity of the metal particles (A) in the central portion and the peripheral portion of the adhesive layer in the surface direction. Presumably, in the paste-like adhesive composition in which the acetone insoluble fraction after heating is equal to or lower than 5% by weight, for the thermally polymerizable compound (B), a linear polymerization reaction may proceed instead of three-dimensional cross-linking. In this case, it is possible to inhibit the sintering of the metal particles (A) from being hindered due to a three-dimensionally cross-linked resin. It is considered that for this reason, although this is not an undoubted reason, the sintering uniformity of the metal particles (A) is improved.

In the present embodiment, the aforementioned acetone insoluble fraction can be measured as below, for example. First, by centrifugation and filtration using a 115 mesh filter (125 μm opening), the metal particles (A) are removed from the paste-like adhesive composition. Then, the paste-like adhesive composition from which the metal particles (A) have been removed is heated under conditions of 180° C. and 2 hours, thereby obtaining a measurement sample. Thereafter, approximately 100 g of the measurement sample was weighed and put into an airtight container containing approximately 900 g of acetone with a liquid temperature of 25° C., and then shaken for about 20 minutes. The acetone solution obtained in this way and an acetone solution obtained by washing off the inside of the airtight container with approximately 100 g of acetone are passed through a 115 mesh JIS standard sieve (125 μm opening). Consequently, approximately 100 g of acetone is passed through the entirety of the sieve. Then, the residue on the sieve is air-dried, and then the weight of the residue is measured. From the measured result, a proportion (% by weight) of the residue with respect to the measurement sample is calculated and taken as an acetone insoluble fraction (% by weight).

The acetone insoluble fraction of the paste-like adhesive composition can be controlled by adjusting the type or the formulation ratio of the components contained in the paste-like adhesive composition, for example. In the present embodiment, the type or the formulation ratio of the thermally polymerizable compound (B) is particularly important. Furthermore, it is considered that in addition to the metal particles (A) or the compound (B), for example, the adjustment of the type or the formulation ratio of the curing agent (C) can be a factor affecting the acetone insoluble fraction. Presumably, in order to control the acetone insoluble fraction within a desired range, it is extremely important to appropriately select the type or the formulation ratio of each of the above components such that a paste-like adhesive composition is constituted in which the compound (B) can be linearly polymerized when being subjected to a thermal treatment.

For example, in a case where the paste-like adhesive composition according to the present embodiment is formed into a coating film by coating, and a film is obtained by heating the coating film to 250° C. from 25° C. at a heating rate of 5° C./min and then heating the coating film under conditions of 250° C. and 2 hours, a thermal conductivity of the film in a thickness direction is preferably equal to or higher than 15 W/mK. In a case where the thermal conductivity is as described above, it is possible to improve the thermal conductivity of an adhesive layer obtained using the paste-like adhesive composition. Therefore, the adhesive layer can contribute to the improvement of the heat release properties of an electronic part constituted with the adhesive layer. In the present embodiment, the thermal conductivity in the thickness direction is preferably equal to or higher than 50 W/mK, and particularly preferably equal to or higher than 60 W/mK. The upper limit of the thermal conductivity in the thickness direction is not particularly limited, and can be set to be equal to or lower than 200 W/mK, for example. The thermal conductivity in the thickness direction can be controlled by adjusting the type or the formulation ratio of components contained in the paste-like adhesive composition, for example.

For example, in a case where the paste-like adhesive composition according to the present embodiment is formed into a coating film by coating, and a film is obtained by heating the coating film to 250° C. from 25° C. at a heating rate of 5° C./min and then heating the coating film under conditions of 250° C. and 2 hours, a volume resistivity of the film in a surface direction is preferably equal to or lower than $25 \times 10^{-6}$ Ω·cm. In a case where the volume resistivity is as described above, the electric conductivity of an adhesive layer obtained using the paste-like adhesive composition can be improved.

In the present embodiment, the volume resistivity in the surface direction is more preferably equal to or lower than $15 \times 10^{-6}$ Ω·cm, and particularly preferably equal to or lower than $8 \times 10^{-6}$ Ω·cm. The volume resistivity in the surface direction can be controlled by adjusting the type or the formulation ratio of components contained in the paste-like adhesive composition for example.

The lower limit of the volume resistivity in the surface direction is not particularly limited, and is equal to or higher than $0.01 \times 10^{-6}$ Ω·cm, for example.

A temperature at 5% weight loss of the paste-like adhesive composition according to the present embodiment is preferably equal to or higher than 100° C. and equal to or lower than 180° C. In a case where the temperature at 5% weight loss is as described above, the sintering of the metal particles (A) can be further accelerated. Therefore, the thermal conductivity or the electric conductivity of an adhesive layer obtained using the paste-like adhesive composition can be further improved. In the present embodiment, from the viewpoint of improving the balance between temporal stability and sintering properties, the temperature at 5% weight loss is preferably equal to or higher than 100° C. and equal to or lower than 160° C. The temperature at 5% weight loss can be controlled by adjusting the type or the formulation ratio of components contained in the paste-like adhesive composition, for example. In the present embodiment, for example, by performing thermogravimetry/differential thermal analysis (TG/DTA) on 10 mg of the paste-like adhesive composition in a nitrogen atmosphere or an air atmosphere under a condition of a heating rate of 5° C./min, the temperature at 5% weight loss of the paste-like adhesive composition can be measured.

Hereinafter, each of the components constituting the paste-like adhesive composition according to the present embodiment will be described.

(Metal Particles (A))

The metal particles (A) contained in the paste-like adhesive composition form a particle coupling structure by causing sintering through a thermal treatment performed on the paste-like adhesive composition. That is, in an adhesive layer obtained by heating the paste-like adhesive composition, the metal particles (A) present in a state of being fused with each other. In a case where the metal particles (A) are present in this state, it is possible to improve the thermal conductivity or the electric conductivity of the adhesive layer obtained by heating the paste-like adhesive composition and to improve the adhesiveness of the adhesive layer with respect to a substrate, a semiconductor element, a heatsink, or the like.

The shape of the metal particles (A) is not particularly limited, and examples of the shape include a spherical shape, a flake shape, a scale shape, and the like. In the present embodiment, the metal particles (A) more preferably contain spherical particles. In a case where the metal particles (A) contain spherical particles, the sintering properties of the metal particles (A) can be further improved, and the metal particles (A) can contribute to the improvement of the sintering uniformity. Furthermore, from the viewpoint of reducing costs, it is possible to adopt an aspect in which the metal particles (A) contain flake-like particles. In addition, from the viewpoint of improving the balance between the cost reduction and the sintering uniformity, the metal particles (A) may contain both of the spherical particles and the flake-like particles.

In the present embodiment, the total amount of the spherical particles and the flake-like particles contained in the metal particles (A) can be equal to or greater than 90% by weight and equal to or less than 100% by weight with respect to the total amount of the metal particles (A). The total amount of the spherical particles and the flake-like particles is more preferably equal to or greater than 95% by weight. In a case where the total amount of the spherical particles and the flake-like particles is as described above, the sintering uniformity can be more effectively improved. From the viewpoint of further improving the sintering uniformity, for example, the amount of spherical particles contained in the metal particles (A) with respect to the total amount of the metal particles (A) is more preferably equal to or greater than 90% by weight and equal to or less than 100% by weight, and even more preferably equal to or greater than 95% by weight.

The metal particles (A) contain one kind of metal or two or more kinds of metals selected from the group consisting of silver (Ag), gold (Au), and copper (Cu), for example. In a case where the metal particles (A) contain the aforementioned metal, it is possible to improve the sintering properties of the metal particles (A) and to effectively improve the thermal conductivity and the electric conductivity of an adhesive layer obtained using the paste-like adhesive composition. For example, for the purpose of accelerating sintering or reducing costs, the metal particles (A) can contain a metal component other than Ag, Au, and Cu, in addition to the aforementioned materials.

The metal particles (A) can contain carbon, for example. The carbon contained in the metal particles (A) functions as a sintering aid when sintering occurs in the metal particles (A). Therefore, the carbon can improve the sintering properties of the metal particles (A). Herein, the state where the metal particles (A) contain carbon include a case where carbon is contained in the interior of the metal particles (A) or a case where carbon is physically or chemically adsorbed onto the surface of the metal particles (A).

As one of the examples of the case where the metal particles (A) contain carbon, an aspect is exemplified in which carbon-containing lubricant is attached to the metal particles (A). Examples of such a lubricant include a higher fatty acid, a higher fatty acid metal salt, a higher fatty acid amide, and a higher fatty acid ester. The content of the lubricant with respect to the total amount of the metal particles (A) is preferably equal to or greater than 0.01% by mass and equal to or less than 5% by mass for example. In a case where the content of the lubricant is within the above range, it is possible to allow the carbon to effectively function as a sintering aid and to inhibit the reduction in the thermal conductivity.

The lower limit of a mean particle size ($D_{50}$) of the metal particles (A) is equal to or greater than 0.1 μm, for example. The upper limit of the mean particle size ($D_{50}$) of the metal particles (A) is equal to or less than 10 μm. In a case where the mean particle size ($D_{50}$) of the metal particles (A) is equal to or greater than the lower limit described above, it is possible to inhibit the specific surface area from excessively increasing and to inhibit the thermal conductivity from decreasing due to thermal contact resistance. In a case where the mean particle size ($D_{50}$) of the metal particles (A) is equal to or less than the upper limit described above, it is possible to improve the sintering properties between the metal particles (A).

From the viewpoint of improving dispensing properties of the paste-like adhesive composition, the mean particle size ($D_{50}$) of the metal particles (A) is more preferably equal to or greater than 0.6 μm and equal to or less than 2.7 μm, and particularly preferably equal to or greater than 0.6 μm and equal to or less than 2.0 μm. The mean particle size ($D_{50}$) of the metal particles (A) can be measured using a commercially available laser particle size distribution analyzer (such as SALD-7000 manufactured by Shimadzu Corporation), for example.

The maximum particle size of the metal particles (A) is not particularly limited, and can be set to be equal to or greater than 1 μm and equal to or less than 50 μm, for example. The maximum particle size of the metal particles (A) is more preferably equal to or greater than 3 μm and equal to or less than 30 μm, and particularly preferably equal to or greater than 4 μm and equal to or less than 18 μm. In a case where the maximum particle size is within the above range, it is possible to more effectively improve the balance between the sintering uniformity and the dispensing properties.

In the present specification, by appropriately combining the upper limit and the lower limit described above, the mean particle size ($D_{50}$) of the metal particles (A) or the like can be determined.

The content of the metal particles (A) in the paste-like adhesive composition is, with respect to the total amount of the paste-like adhesive composition, preferably equal to or greater than 80% by weight, and more preferably equal to or greater than 85% by weight, for example. In a case where the content of the metal particles (A) is as described above, the sintering properties of the metal particles (A) can be improved, and the metal particles (A) can contribute to the improvement of the thermal conductivity and the electric conductivity. In contrast, the content of the metal particles (A) in the paste-like adhesive composition is, with respect to the total amount of the paste-like adhesive composition, preferably equal to or less than 95% by weight, and particularly preferably equal to or less than 90% by weight, for example. In a case where the content of the metal particles (A) is as described above, the metal particles (A) can contribute to the improvement of the overall coating workability of the paste-like adhesive composition, the mechanical strength of the adhesive layer, and the like. In the present specification, in a case where the paste-like adhesive composition contains a solvent, the content with respect to the composition refers to a content with respect to all the components of the paste-like adhesive composition excluding the solvent.

(Thermally Polymerizable Compound (B))

The thermally polymerizable compound (B) can contain one kind of compound or two or more kinds of compounds selected from compound (B1) having only one radically polymerizable double bond in a molecule and compound (B2) having only one epoxy group in a molecule, for example. In a case where the compound (B) contains the aforementioned compound, when the paste-like adhesive composition is thermally treated, the compound (B) can be linearly polymerized. Therefore, the balance between the sintering uniformity and the dispensing properties can be improved. From the viewpoint of reducing the volume resistivity of an adhesive layer obtained using the paste-like adhesive composition, the compound (B) more preferably contains at least compound (B1) among the compounds exemplified above.

Compound (B1) having only one radically polymerizable double bond in a molecule contains one kind of compound or two or more kinds of compounds selected from a compound having only one (meth)acryl group in a molecule, a compound having only one vinyl group in a molecule, a compound having only one allyl group in a molecule, a compound having only one maleimide group in a molecule, and a compound having only one maleic acid group in a molecule, for example. In the present embodiment, from the viewpoint of more effectively improving the sintering uniformity, compound (B1) more preferably contains at least a compound having only one (meth)acryl group in a molecule. Compound (B1) can contain, as the compound having only one (meth)acryl group in a molecule, a (meth)acrylic acid ester having only one (meth)acryl group in a molecule, for example.

The (meth)acrylic acid ester contained in compound (B1) having only one radically polymerizable double bond in a molecule can contain one kind of compound or two or more kinds of compounds selected from a compound represented by Formula (1) and a compound represented by Formula (2), for example. In a case where compound (B1) contains the above compound, the sintering uniformity can be more effectively improved.

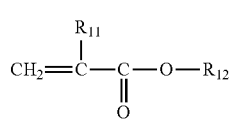
(1)

In Formula (1), $R_{11}$ represents hydrogen or a methyl group, and $R_{12}$ represents a monovalent organic group which contains an OH group and has 1 to 20 carbon atoms. $R_{12}$ may contain one kind of atom or two or more kinds of atoms among an oxygen atom, a nitrogen atom, and a phosphorus atom. The compound represented by Formula (1) is not particularly limited. For example, the (meth)acrylic acid ester can contain one kind of compound or two or more kinds of compounds selected from 1,4-cyclohexanedimethanol monoacrylate, 2-hydroxyethyl acrylate, 2-hydroxyethyl methacrylate, 2-hydroxypropyl acrylate, 2-hydroxypropyl methacrylate, 2-hydroxybutyl acrylate, 2-hydroxybutyl methacrylate, 2-hydroxy-3-phenoxypropyl acrylate, 2-acryloyloxyethyl succinate, 2-methacryloyloxyethyl succinate, 2-acryloyloxyethyl hexahydrophthalate, 2-methacryloyloxyethyl hexahydrophthalate, 2-acryloyloxyethyl phthalate, 2-acryloyloxyethyl-2-hydroxyethyl phthalate, 2-acryloyloxyethyl acid phosphate, and 2-methacryloyloxyethyl acid phosphate. In the present embodiment, as one of the examples of preferred aspects, it is possible to adopt a case where the (meth)acrylic acid ester contains a compound containing a cyclic structure in $R_{12}$ as illustrated in 1,4-cyclohexanedimethanol monoacrylate or a compound containing a carboxyl group in $R_{12}$ as illustrated in 2-methacryloyloxyethyl succinate.

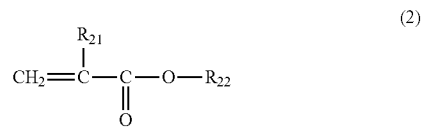
(2)

In Formula (2), $R_{21}$ represents hydrogen or a methyl group, and $R_{22}$ represents a monovalent organic group which does not contain an OH group and has 1 to 20 carbon atoms. $R_{22}$ may contain one kind of atom or two or more kinds of atoms among an oxygen atom, a nitrogen atom, and a phosphorus atom. The compound represented by Formula (2) is not particularly limited. For example, the (meth)acrylic acid ester can contain one kind of compound or two or more kinds of compounds selected from ethyl methacrylate, n-butyl methacrylate, isobutyl methacrylate, tert-butyl methacrylate, isoamyl acrylate, 2-ethylhexyl methacrylate, isodecyl methacrylate, n-lauryl acrylate, n-lauryl methacrylate, n-tridecyl methacrylate, n-stearyl acrylate, n-stearyl methacrylate, isostearyl acrylate, ethoxydiethylene glycol acrylate, butoxydiethylene glycol methacrylate, methoxytriethylene glycol acrylate, 2-ethylhexyl diethylene glycol acrylate, methoxypolyethylene glycol acrylate, methoxypolyethylene glycol methacrylate, methoxydipropylene glycol acrylate, cyclohexyl methacrylate, tetrahydrofurfuryl acrylate, tetrahydrofurfuryl methacrylate, benzyl methacrylate, phenoxyethyl acrylate, phenoxyethyl methacrylate, phenoxydiethylene glycol acrylate, phenoxypolyethylene glycol acrylate, nonyl phenol ethylene oxide-modified acrylate, phenyl phenol ethylene oxide-modified acrylate, isobornyl acrylate, isobornyl methacrylate, dimethylaminoethyl methacrylate, diethylaminoethyl methacrylate, quaternized dimethylaminoethyl methacrylate, glycidyl methacrylate, and neopentyl glycol acrylate benzoic acid ester. In the present embodiment, as one of the examples of preferred aspects, it is possible to adopt a case where the (meth)acrylic acid ester contains a compound containing a cyclic structure in $R_{22}$ as illustrated in phenoxyethyl methacrylate and cyclohexyl methacrylate or a compound in which $R_{22}$ is a linear or branched alkyl group as illustrated in 2-ethylhexyl methacrylate, n-lauryl acrylate, and n-lauryl methacrylate.

In the present embodiment, from the viewpoint of improving balance between various properties such as the sintering uniformity and the mechanical strength, it is possible to adopt an aspect in which the (meth)acrylic acid ester contained in compound (B1) having only one radically polymerizable double bond in a molecule contains both of the compound represented by Formula (1) and the compound represented by Formula (2), for example. In contrast, compound (B1) may contain only any one of the compound represented by Formula (1) and the compound represented by Formula (2).

Compound (B2) having only one epoxy group in a molecule can contain one kind of compound or two or more kinds of compounds selected from, n-butylglycidyl ether, a versatic acid glycidyl ester, styrene oxide, ethyl hexyl glycidyl ether, phenyl glycidyl ether, butyl phenyl glycidyl ether, and cresyl glycidyl ether, for example. From the viewpoint of improving the balance among the sintering uniformity, the thermal conductivity, the electric conductivity, and the like, as one of the examples of preferred aspect, it is possible to adopt a case where compound (B2) contains at least cresyl glycidyl ether among the above compounds.

In the present embodiment, for example, it is possible to adopt an aspect in which the compound (B) contains compound (B2) but does not contain compound (B3) having two or more epoxy groups in a molecule. The aspect in which the compound (B) does not contain compound (B3) refers to a case where the content of compound (B3) with respect to the total amount of the thermally polymerizable compound (B) is equal to or less than 0.01% by weight, for example. In a case where the compound (B) contains both of compound (B2) and compound (B3), from the viewpoint of improving the balance between the sintering uniformity and the dispensing properties, as one of the examples of preferred aspects, it is possible to adopt a case where the content of compound (B3) with respect to the total amount of the compound (B) is greater than 0.01% by weight and equal to or less than 60% by weight.

It is preferable that the thermally polymerizable compound (B) does not contain a compound having two or more radically polymerizable double bonds in a molecule or a compound having two or more epoxy groups in a molecule, for example. In a case where the compound (B) does not contain the above compound, the compound (B) can be linearly polymerized and can contribute to the improvement of the sintering uniformity. In contrast, the compound (B) may contain a compound having two or more radically polymerizable double bonds in a molecule or a compound having two or more epoxy groups in a molecule. In a case where the compound (B) contains the compound having two or more radically polymerizable double bonds in a molecule or the compound having two or more epoxy groups in a molecule, the total content of the aforementioned compounds is preferably set to be greater than 0% by weight and equal to or less than 5% by weight with respect to the total amount of the compound (B). In a case where total content of the aforementioned compound is within the above range, it is possible to inhibit many three-dimensional cross-linked structures from being incorporated into the polymerized structure generated by the compound (B). As a result, it is possible to inhibit the sintering of the metal particles (A) from being hindered due to three-dimensional cross-linked structures.

The content of the thermally polymerizable compound (B) contained in the paste-like adhesive composition is, with respect to the total amount of the paste-like adhesive composition, preferably equal to or greater than 5% by weight, more preferably equal to or greater than 8% by weight, and particularly preferably equal to or greater than 10% by weight, for example. In a case where the content of the compound (B) is as described above, it is possible to more effectively improve the sintering uniformity, and the compound (B) can contribute to the improvement of the mechanical strength of the adhesive layer and the like. In contrast, the content of the compound (B) contained in the paste-like adhesive composition is, with respect to the total amount of the paste-like adhesive composition, preferably equal to or less than 20% by weight, more preferably equal to or less than 18% by weight, and particularly preferably equal to or less than 15% by weight, for example. In a case where the content of the compound (B) is as described above, the compound (B) can contribute to the improvement of the sintering properties of the metal particles (A).

(Curing Agent (C))

The paste-like adhesive composition can contain the curing agent (C), for example. The curing agent (C) is not particularly limited as long as it can accelerate the polymerization reaction of the thermally polymerizable compound (B). In a case where the paste-like adhesive composition contains the curing agent (C), the polymerization reaction of the compound (B) can be accelerated, and the curing agent (C) can contribute to the improvement of the mechanical properties obtained using the paste-like adhesive composition.

In the present embodiment, from the viewpoint of improving the balance among the sintering uniformity, the thermal conductivity, the electric conductivity, and the like, it is possible to adopt an aspect in which the paste-like adhesive composition does not contain the curing agent (C). The aspect in which the paste-like adhesive composition does not contain the curing agent (C) refers to a case where the content of the curing agent (C) with respect to 100 parts by weight of the thermally polymerizable compound (B) is equal to or less than 0.01 parts by weight, for example.

The curing agent (C) can contain a compound having a tertiary amino group, for example. If the curing agent (C) contains such a compound, for example, in a case where the thermally polymerizable compound (B) contains a compound having an epoxy group in a molecule, it is possible to accelerate the linear polymerization of the compound (B). Examples of the compound having a tertiary amino group include tertiary amines such as benzyldimethylamine (BDMA), imidazoles such as 2-methylimidazole and 2-ethyl-4-methylimidazole (EMI 24), pyrazoles such as pyrazole, 3,5-dimethylpyrazole, and pyrazoline, triazoles such as triazole, 1,2,3-triazole, 1,2,4-triazole, and 1,2,3-benzotriazole, and imidazolines such as imidazoline, 2-methyl-2-imidazoline, and 2-phenylimidazoline. The curing agent (C) can contain one kind of compound or two or more kinds of compounds selected from these. If the curing agent (C) contains the above compound, for example, in a case where the thermally polymerizable compound (B) contains a compound having an epoxy group in a molecule, the ring-opening homopolymerization of the epoxy group can be selectively accelerated. From the viewpoint of improving the balance among the sintering uniformity, the thermal conductivity, and the electric conductivity, as one of the examples of preferred aspects, it is possible to adopt an aspect in which the curing agent (C) contains at least imidazoles among the above compounds.

The curing agent (C) can contain a radical polymerization initiator, for example. If the curing agent (C) contains a radical polymerization initiator, for example, in a case where the thermally polymerizable compound (B) contains a compound having a radically polymerizable double bond in a molecule, it is possible to accelerate the polymerization of the compound (B). The curing agent (C) can contain, as the radical polymerization initiator, one kind of compound or two or more kinds of compounds selected from octanoyl peroxide, lauroyl peroxide, stearoyl peroxide, 1,1,3,3-tetramethylbutyl peroxy-2-ethyl hexanoate, oxalic acid peroxide, 2,5-dimethyl-2,5-di(2-ethylhexanoylperoxy)hexane, 1-cyclohexyl-1-methylethylperoxy-2-ethylhexanoate, t-hexylperoxy-2-ethylhexanoate, t-butylperoxy-2-ethylhexanoate, m-toluyl peroxide, benzoyl peroxide, methyl ethyl ketone peroxide, acetyl peroxide, t-butyl hydroperoxide, di-t-butyl peroxide, cumene hydroperoxide, dicumyl peroxide, t-butyl perbenzoate, parachlorobenzoyl peroxide, and cyclohexanone peroxide.

In a case where the paste-like adhesive composition of the present embodiment contains a compound having an epoxy group (compound (B2) having only one epoxy group in a molecule described above, compound (B3) having two or more epoxy groups in a molecule, or the like), a component that results in curing of the epoxy moiety can be contained as the curing agent (C) in the paste-like adhesive composition.

Specifically, as the curing agent (C), a compound such as bisphenol A, bisphenol F, bisphenol S, biphenol, or phenyl phenol or a phenol novolac-type resin can be contained in the composition.

The content of the curing agent (C) contained in the paste-like adhesive composition can be set to be equal to or less than 25 parts by weight with respect to 100 parts by weight of the thermally polymerizable compound (B), for example. Particularly, in a case where the paste-like adhesive composition contains compound (B1) having only one radically polymerizable double bond in a molecule as the compound (B), from the viewpoint of improving the sintering uniformity, the content of the curing agent (C) with respect to 100 parts by weight of the compound (B) is preferably set to be equal to or less than 5 parts by weight, more preferably set to be equal to or less than 3 parts by weight, and particularly preferably set to be equal to or less than 1 part by weight. Furthermore, the content of the curing agent (C) contained in the paste-like adhesive composition can be set to be equal to or greater than 0 part by weight with respect to 100 parts by weight of the compound (B). From the viewpoint of improving the mechanical properties of the paste-like adhesive composition, the content of the curing agent (C) with respect to 100 parts by weight of the compound (B) can be set to be equal to or greater than 0.1 parts by weight, for example.

(Polymerization Inhibitor (D))

The paste-like adhesive composition can contain a polymerization inhibitor (D), for example. As the polymerization inhibitor (D), a compound inhibiting the polymerization reaction of the compounds contained in the paste-like adhesive composition is used. In a case where the paste-like adhesive composition contains the polymerization inhibitor (D), the storage properties of the paste-like adhesive composition can be further improved. The polymerization inhibitor (D) is not particularly limited. For example, the paste-like adhesive composition can contain, as the polymerization inhibitor (D), one kind of compound or two or more kinds of compounds selected from hydroquinones such as hydroquinone, p-tert-butylcatechol, and mono-tert-butyl hydroquinone, phenols such as hydroquinone monomethyl ether and di-p-cresol, quinones such as p-benzoquinone, naphthoquinone, and p-toluquinone, and a copper salt such as copper naphthenate.

The content of the polymerization inhibitor (D) in the paste-like adhesive composition is, with respect to 100 parts by weight of the thermally polymerizable compound (B), preferably equal to or greater than 0.0001 parts by weight, and more preferably equal to or greater than 0.001 parts by weight, for example. In a case where the content of the polymerization inhibitor (D) is as described above, the polymerization inhibitor (D) can contribute to the improvement of the sintering uniformity, and the storage properties of the paste-like adhesive composition can be more effectively improved. In contrast, the content of the polymerization inhibitor (D) in the paste-like adhesive composition is, with respect to 100 parts by weight of the compound (B), preferably set to be equal to or less than 0.5 parts by weight, and more preferably set to be equal to or less than 0.1 parts by weight, for example. In a case where the content of the polymerization inhibitor (D) is as described above, the mechanical strength of the adhesive layer and the like can be improved.

The paste-like adhesive composition according to the present embodiment can contain a solvent, for example. In a case where the paste-like adhesive composition contains a solvent, the fluidity of the paste-like adhesive composition is improved, and hence the solvent can contribute to the improvement of workability. The solvent is not particularly limited. The paste-like adhesive composition can contain, as the solvent, one kind of solvent or two or more kinds of solvents selected from alcohols such as ethyl alcohol, propyl alcohol, butyl alcohol, pentyl alcohol, hexyl alcohol, heptyl alcohol, octyl alcohol, nonyl alcohol, decyl alcohol, ethylene glycol monomethyl ether, ethylene glycol monoethyl ether, ethylene glycol monopropyl ether, ethylene glycol monobutyl ether, propylene glycol monomethyl ether, propylene glycol monoethyl ether, propylene glycol monopropyl ether, propylene glycol monobutyl ether, methyl methoxybutanol, α-terpineol, β-terpineol, hexylene glycol, benzyl alcohol, 2-phenylethyl alcohol, isopalmityl alcohol, isostearyl alcohol, lauryl alcohol, ethylene glycol, propylene glycol, and glycerin; ketones such as acetone, methyl ethyl ketone, methyl isobutyl ketone, cyclohexanone, diacetone alcohol (4-hydroxy-4-methyl-2-pentanone), 2-octanone, isophorone (3,5,5-trimethyl-2-cyclohexen-1-one), and diisobutyl ketone (2,6-dimethyl-4-heptanone); esters such as ethyl acetate, butyl acetate, diethyl phthalate, dibutyl phthalate, acetoxyethane, methyl butyrate, methyl hexanoate, methyl octanoate, methyl decanoate, methyl cellosolve acetate, ethylene glycol monobutyl ether acetate, propylene glycol monomethyl ether acetate, 1,2-diacetoxyethane, tributyl phosphate, tricresyl phosphate, and tripentyl phosphate; ethers such as tetrahydrofuran, dipropyl ether, ethylene glycol dimethyl ether, ethylene glycol diethyl ether, ethylene glycol dibutyl ether, propylene glycol dimethyl ether, ethoxyethyl ether, 1,2-bis(2-diethoxy)ethane, and 1,2-bis(2-methoxyethoxy)ethane; ester ethers such as 2-(2butoxyethoxy) ethane acetate; ether alcohols such as 2-(2-methoxyethoxy)ethanol; hydrocarbons such as toluene, xylene, n-paraffin, isoparaffin, dodecylbenzene, turpentine oil, kerosene, and diesel oil; nitriles such as acetonitrile and propionitrile; amides such as acetamide and N,N-dimethylformamide; low-molecular weight volatile silicon oil, and organically modified volatile silicon oil.

Next, an example of the semiconductor device according to the present embodiment will be described.

FIG. 1 is a cross-sectional view showing a semiconductor device 100 according to the present embodiment. The semiconductor device 100 according to the present embodiment includes a substrate 30, and a semiconductor element 20 mounted on the substrate 30 through a die-attach layer 10 which is obtained by thermally treating the paste-like adhesive composition. The semiconductor element 20 and the substrate 30 are electrically connected to each other through a bonding wire 40, for example. The semiconductor element 20 is sealed with a sealing resin 50, for example. The film thickness of the die-attach layer 10 is not particularly limited, but is equal to or greater than 5 μm and equal to or less than 100 μm, for example.

In the example shown in FIG. 1, the substrate 30 is a lead frame, for example. In this case, the semiconductor element 20 is mounted on a die pad 32 (30) through the die-attach layer 10. The semiconductor element 20 is electrically connected to an outer lead 34 (30) through the bonding wire 40, for example. The substrate 30 as a lead frame is constituted with a 42 alloy or a Cu frame, for example. The substrate 30 may be an organic substrate or a ceramic substrate. As the organic substrate, for example, the substrates obtained using an epoxy resin, a cyanate resin, a maleimide resin, and the like that are known to those in the related art are suitable. Furthermore, the surface of the substrate 30 may be coated with silver or the like such that the adhesiveness of the paste-like adhesive composition with respect to the substrate is improved.

The planar shape of the semiconductor element 20 is not particularly limited, but is a rectangular shape, for example. In the present embodiment, for example, it is possible to adopt a rectangular semiconductor element 20 having a chip size of equal to or greater than 0.5 mm☐ and equal to or less than 15 mm☐.

One of the examples of the semiconductor device 100 according to the present embodiment is a semiconductor device in which a large rectangular chip having a length of, for example, equal to or greater than 5 mm on one side is used as the semiconductor element 20. In this case, because the area of a die-attach layer also increases, there is apprehension that it will be difficult to uniformly sinter metal particles in the central portion and the peripheral portion of the die-attach layer. According to the present embodiment, even in a case where such a large chip is used, by forming the die-attach layer by using the aforementioned paste-like adhesive composition, the sintering uniformity of the metal particles in the central portion and the peripheral portion of the die-attach layer can be greatly improved.

Figure 2:
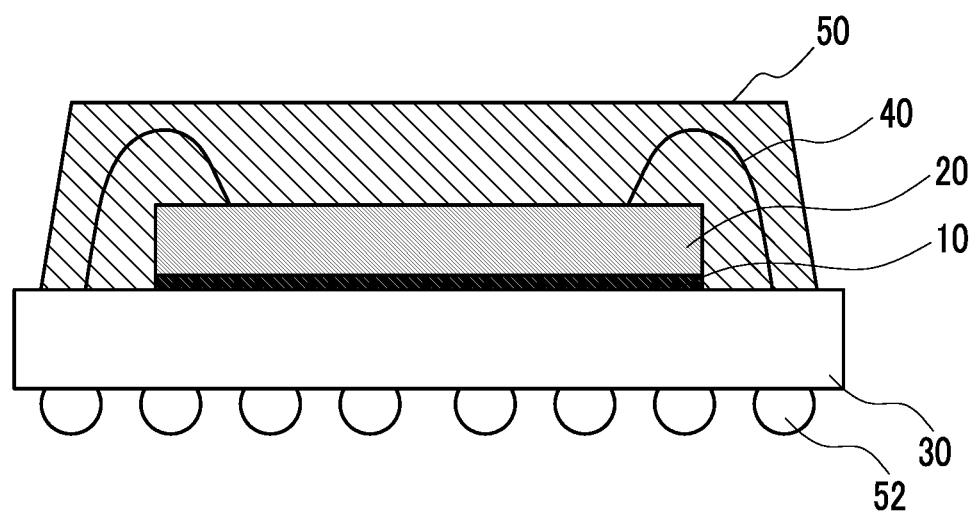
FIG. 2 is a cross-sectional view showing a modification example of the semiconductor device shown in FIG. 1.

FIG. 2 is a cross-sectional view showing a modification example of the semiconductor device 100 shown in FIG. 1.

In the semiconductor device 100 according to the present modification example, the substrate 30 is an interposer, for example. In the substrate 30 as an interposer, on a surface opposite to the surface on which the semiconductor element 20 is mounted, for example, a plurality of solder balls 52 is formed. In this case, the semiconductor device 100 is connected to other wiring boards through the solder balls 52.

The semiconductor device 100 according to the present embodiment can be manufactured as below, for example. First, through the aforementioned paste-like adhesive composition, which contains the metal particles (A) and the thermally polymerizable compound (B) and in which the metal particles (A) form a particle coupling structure by causing sintering through a thermal treatment, the semiconductor element 20 is mounted on the substrate 30. Then, the paste-like adhesive composition is heated. In this way, the semiconductor device 100 is manufactured.

Hereinafter, the method for manufacturing the semiconductor device 100 will be specifically described.

First, through the aforementioned paste-like adhesive composition, the semiconductor element 20 is mounted on the substrate 30. In the present embodiment, for example, the substrate 30 is coated with the paste-like adhesive composition, and then the semiconductor element 20 is mounted on the coating film formed of the paste-like adhesive composition. The coating method of the paste-like adhesive composition is not particularly limited, and examples thereof include dispensing, a printing method, and an ink jet method.

Thereafter, the paste-like adhesive composition is subjected to a thermal treatment. At this time, sintering occurs in the metal particles (A) in the paste-like adhesive composition, and hence a particle coupling structure is formed between the metal particles (A). As a result, the die-attach layer 10 is formed on the substrate 30. In the present embodiment, for example, it is possible to perform the thermal treatment in a state of applying a pressure to the paste-like adhesive composition.

In the present embodiment, for example, it is possible to perform a step (hereinafter, referred to as a first thermal treatment as well) of heating the paste-like adhesive composition under a temperature condition of lower than 200° C. and then perform a step (hereinafter, referred to as a second thermal treatment as well) of heating the paste-like adhesive composition under a temperature condition of equal to or higher than 200° C. In this way, by heating the paste-like adhesive composition according to the present embodiment under a low-temperature condition of lower than 200° C. in the first thermal treatment, it is possible to more reliably inhibit the proceeding of sintering of the metal particles (A) from being hindered due to a binder component (the thermally polymerizable compound (B)) or the like. Accordingly, in both of the peripheral portion and the central portion of the die-attach layer, the metal particles (A) can be more uniformly and sufficiently sintered.

For example, in the manufacturing method according to the present embodiment, by heating the composition for a certain period of time under a temperature condition of a temperature $T_1$ lower than 200° C. and then heating the composition for a certain period of time under a temperature condition of a temperature of $T_2$ equal to or higher than 200° C., the first thermal treatment and the second thermal treatment can be performed. $T_1$ can be set to be equal to or higher than 120° C. and lower than 200° C., for example. $T_2$ can be set to be equal to or higher than 200° C. and equal to or lower than 350° C., for example. In the present example, the treatment time of the first thermal treatment performed at the temperature T; can be set to be equal to or longer than 20 minutes and equal to or shorter than 90 minutes, for example. Furthermore, the treatment time of the second thermal treatment performed at the temperature $T_2$ can be set to be equal to or longer than 30 minutes and equal to or shorter than 180 minutes, for example.

Meanwhile, in the present embodiment, by heating the composition to a temperature $T_3$ which is equal to or higher than 200° C. from 25° C. without cease and then heating the composition for a certain period of time under a temperature condition of the temperature $T_3$, the thermal treatment may be performed on the paste-like adhesive composition. In this case, a period of time during which the temperature does not yet reach 200° C. in the step of heating can be regarded as the first thermal treatment, and a step of heating the composition to the temperature $T_3$ from 200° C. and performing a thermal treatment at the temperature $T_3$ can be regarded as the second thermal treatment. $T_3$ can be set to be equal to or higher than 200° C. and equal to or lower than 350° C., for example.

Then, the semiconductor element 20 and the substrate 30 are electrically connected to each other by using the bonding wire 40. Subsequently, the semiconductor element 20 is sealed with the sealing resin 50. In the present embodiment, the semiconductor device 100 can be manufactured in this way, for example.

In the present embodiment, a heatsink may be bonded to the semiconductor device, for example. In this case, for example, through an adhesive layer obtained by performing a thermal treatment on the paste-like adhesive composition, the heatsink can be bonded to the semiconductor device.

The heatsink can be bonded by the following method, for example. First, through the aforementioned paste-like adhesive composition, the heatsink is bonded to the semiconductor device. Then, a thermal treatment is performed on the paste-like adhesive composition. The thermal treatment for the paste-like adhesive composition can be performed in the same manner as in the step of forming the die-attach layer 10 by performing a thermal treatment on the paste-like adhesive composition in the aforementioned method for manufacturing the semiconductor device 100, for example. In a case where the thermal treatment is performed as above, sintering occurs in the metal particles (A) in the paste-like adhesive composition. As a result, a particle coupling structure is formed between the metal particles (A), and an adhesive layer to which the heatsink is bonded is formed. In this way, the heatsink can be bonded to the semiconductor device.

The present invention is not limited to the embodiment described above, and includes modification, amelioration, and the like within a scope in which the object of the present invention can be achieved.

EXAMPLES

Next, examples of the present invention will be described.

(Preparation of Paste-Like Adhesive Composition)

For each of examples and comparative examples, a paste-like adhesive composition was prepared. The compositions were prepared by homogeneously mixing each of the components together according to the formulation shown in Tables 1, 2, and 3. The details of the components shown in Tables 1, 2, and 3 are as below. The formulation ratio of each of the components in Tables 1, 2, and 3 represents a formulation ratio (% by weight) of each of the components with respect to the total amount of the paste-like adhesive composition.

(Metal Particles (A))

Metal particles 1: spherical silver powder (AG 2-1C, manufactured by DOWA Electronics Materials Co., Ltd, mean particle size $D_{50}$=0.8 μm)

Metal particles 2: spherical silver powder (AgC-G, manufactured by FUKUDA METAL FOIL & POWDER Co., LTD., mean particle size $D_{50}$=0.23 μm)

Metal particles 3: spherical silver powder (AG 4-8F, manufactured by DOWA Electronics Materials Co., Ltd, mean particle size $D_{50}$=1.9 μm)

(Thermally Polymerizable Compound (B))

Compound 1: 1,4-cyclohexanedimethanol monoacrylate (CHDMMA (trade name), manufactured by Nippon Kasei Chemical Co., Ltd)

Compound 2: phenoxyethyl methacrylate (LIGHT ESTER PO, manufactured by KYOEISHA CHEMICAL Co., LTD)

Compound 3: 2-ethylhexyl methacrylate (LIGHT ESTER EH, manufactured by KYOEISHA CHEMICAL Co., LTD)

Compound 4: meta•para-cresyl glycidyl ether (m,p-CGE (trade name), manufactured by Sakamoto Yakuhin kogyo Co., Ltd.) Compound 5: bisphenol F-type epoxy resin (SB-403S, manufactured by Nippon Kayaku Co., Ltd)

Compound 6: polyethylene glycol #200 dimethacrylate (LIGHT ESTER 4EG, manufactured by KYOEISHA CHEMICAL Co., LTD)

Compound 7: 1,6-hexanediol dimethacrylate (LIGHT ESTER 1.6HX, manufactured by KYOEISHA CHEMICAL Co., LTD)

(Curing Agent (C))

Curing agent 1: dicumyl peroxide (PERKADOX BC, manufactured by Kayaku Akzo Corporation)

Curing agent 2: imidazole (2PHZ-PW, manufactured by SHIKOKU CHEMICALS CORPORATION)

Curing agent 3: bisphenol F (DIC-BPF, manufactured by DIC Corporation)

It was understood that a linear polymer molecular structure is obtained in each of the examples. Furthermore, it was understood that a polymer molecular structure having a three-dimensional cross-linked structure is obtained in each of the comparative examples.

For each of the examples, a coating film obtained by performing coating by using the obtained paste-like adhesive composition was heated to 250° C. from 25° C. at a heating rate of 5° C./min in a nitrogen atmosphere with a residual oxygen concentration of lower than 1,000 ppm. Then, a thermal treatment was performed on the coating film under conditions of 250° C. and 2 hours. As a result, the metal particles (A) in the coating film caused sintering and formed a particle coupling structure.

(Acetone Insoluble Fraction)

For each of the examples and comparative examples, an acetone insoluble fraction of the obtained paste-like adhesive composition was measured as below. First, by centrifugation and filtration using a 115 mesh filter (125 μm opening), the metal particles (A) were removed from the paste-like adhesive composition. Then, the paste-like adhesive composition from which the metal particles (A) had been removed was heated under conditions of 180° C. and 2 hours, thereby obtaining a measurement sample. Thereafter, approximately 100 g of the measurement sample was weighed and put into an airtight container containing approximately 900 g of acetone with a liquid temperature of 25° C., and then shaken for about 20 minutes. The acetone solution obtained in this way and an acetone solution obtained by washing off the inside of the airtight container with approximately 100 g of acetone were passed through a 115 mesh JIS standard sieve (125 μm opening). Consequently, approximately 100 g of acetone was passed through the entirety of the sieve. Then, the residue on the sieve was air-dried, and then the weight of the residue was measured. From the measured result, a proportion (% by weight) of the residue with respect to the total amount of the measurement sample was calculated and taken as an acetone insoluble fraction (% by weight). In Tables 1 to 3, "equal to or lower than 5" is listed for the composition in which the acetone insoluble fraction is equal to or lower than 5% by weight, and "higher than 5" is listed for the composition in which the acetone insoluble fraction is higher than 5% by weight.

(Measurement of Dynamic Viscoelasticity)

For each of the examples and comparative examples, the dynamic viscoelasticity of the obtained paste-like adhesive composition was measured. The dynamic viscoelasticity was measured using a rheometer (HAAKE RheoWin, manufactured by Thermo Fisher Scientific) under conditions of a measurement frequency of 1 Hz, a heating rate of 5° C./min, and a range of measurement temperature of 25° C. to 250° C. From the measured results, a temperature width W (° C.) in which a shear modulus of elasticity was equal to or higher than 5,000 Pa and equal to or lower than 100,000 Pa within a temperature region of 140° C. to 180° C. was calculated. The results are shown in Tables 1 to 3.

(Measurement of Thermal Conductivity)

For each of the examples and comparative examples, the thermal conductivity was measured as below. First, coating was performed using the obtained paste-like adhesive composition, and then the coating film was heated to 250° C.

from 25° C. at a heating rate of 5° C./min in a nitrogen atmosphere and then heated under conditions of 250° C. and 2 hours, thereby obtaining a sample (film thickness: 1,000 μm). Thereafter, by a laser flash method, the thermal conductivity of the sample in a thickness direction was measured. The results are shown in Tables 1 to 3.

(Measurement of Volume Resistivity)

For each of the examples and comparative examples, the volume resistivity was measured as below. First, coating was performed using the obtained paste-like adhesive composition, and the coating film was heated to 250° C. from 25° C. at a heating rate of 5° C./min in a nitrogen atmosphere and then heated under conditions of 250° C. and 2 hours, thereby obtaining a sample (width: 4 mm, length: 40 mm, thickness: 40 μm). Thereafter, the volume resistivity of the sample in a plane direction was measured based on JIS K 6911. The results are shown in Tables 1 to 3.

(Temperature at 5% Weight Loss)

For Example 6, the temperature at 5% weight loss of the paste-like adhesive composition was measured. By performing thermogravimetry/differential thermal analysis (TG/DTA) on 10 mg of the paste-like adhesive composition under a condition of a heating rate of 5° C./min, the temperature at 5% weight loss was measured. As a result of measuring the temperature at 5% weight loss under each of the conditions of a nitrogen atmosphere and an air atmosphere, the temperature at 5% weight loss was found to be 130° C. under any condition.

(Evaluation of Dispensing Properties)

For each of the examples and comparative examples, the dispensing properties were evaluated as below. First, a syringe was filled with the obtained paste-like adhesive composition, and a needle having an inner diameter of 200 μm as a nozzle diameter was mounted on the syringe. Then, by using an automatic dispenser, coating was performed by means of dispensing the paste in the form of a dot. Furthermore, the threading properties at the time of coating were visually observed. The paste that did not show the threading and the deformation of dots was marked with A, the paste that showed either the threading or the deformation of dots was marked with B, and the paste that showed both of the threading and the deformation of dots was marked with C.

(Preparation of Semiconductor Device 1)

For each of the examples and comparative examples, a semiconductor device 1 was prepared as below. First, a 10 mm×10 mm×350 pmt rectangular silicon chip with a Au-plated rear surface was mounted on a Ag-plated copper frame (11 mm×11 mm×150 pmt) through the paste-like adhesive composition obtained as above, thereby obtaining a laminate. Then, in a nitrogen atmosphere with a residual oxygen concentration of lower than 1,000 ppm, the laminate was heated to 250° C. from 25° C. at a heating rate of 5° C./min in an oven and then heated at 250° C. for 2 hours. In this way, the metal particles (A) in the paste-like adhesive composition were sintered, and a die-attach layer having a thickness of 60 μm was formed. In this way, a semiconductor device 1 was obtained.

(Evaluation of Sintering Uniformity)

For each of the examples and comparative examples, the cross-sectional structure of the die-attach layer of the semiconductor device 1 was observed. Herein, within the die-attach layer, the central portion and the peripheral portion in the surface direction were observed. The semiconductor device in which the sintering of the metal particles (A) sufficiently occurred in both of the central portion and the peripheral portion was marked with O, and the semiconductor device in which the sintering of the metal particles (A) did not sufficiently occur in either the central portion or the peripheral portion was marked with X. In this way, whether or not the sintering can be uniformly performed was evaluated. The results are shown in Tables 1 to 3.

TABLE 1

| | | | | Example 1 | Example 2 | Example 3 | Example 4 | Example 5 | Example 6 | Example 7 | Example 8 |
|---|---|---|---|---|---|---|---|---|---|---|---|
| Paste-like adhesive composition | Metal particles (A) | Metal particles 1 | | 90 | 90 | 85 | 90 | 90 | 90 | 90 | 90 |
| | | Metal particles 2 | | | | | | | | | |
| | | Metal particles 3 | | | | | | | | | |
| | Thermally polymerizable compound (B) | Compound 1 | Monofunctional acryl | 10 | 10 | 15 | 8 | 5 | 2 | 2 | |
| | | Compound 2 | Monofunctional acryl | | | | 2 | 5 | 8 | 8 | 10 |
| | | Compound 3 | Monofunctional acryl | | | | | | | | |
| | | Compound 4 | Monofunctional epoxy | | | | | | | | |
| | | Compound 5 | Bifunctional epoxy | | | | | | | | |
| | | Compound 6 | Bifunctional acryl | | | | | | | | |
| | | Compound 7 | Bifunctional acryl | | | | | | | | |
| | Curing agent (C) | Curing agent 1 | | | 0.05 | | | | | 0.05 | |
| | | Curing agent 2 | | | | | | | | | |
| | | Curing agent 3 | | | | | | | | | |
| Acetone insoluble fraction (% by weight) | | | | Equal to or lower than 5 | Equal to or lower than 5 | Equal to or lower than 5 | Equal to or lower than 5 | Equal to or lower than 5 | Equal to or lower than 5 | Equal to or lower than 5 | Equal to or lower than 5 |
| Temperature width W [° C.] | | | | 28 | 22 | 40 | 23 | 25 | 26 | 22 | 31 |
| Thermal conductivity (thickness direction) [W/mK] | | | | 88 | 62 | 76 | 88 | 105 | 120 | 90 | 150 |
| Volume resistivity (surface direction) [$10^{-6}$ Ω·cm] | | | | 3 | 5 | 7 | 3 | 3 | 4 | 4 | 4 |
| Dispensing properties | | | | A | A | A | A | A | A | A | A |
| Evaluation of sintering uniformity | | | | ○ | ○ | ○ | ○ | ○ | ○ | ○ | ○ |

TABLE 2

|  |  |  |  | Example 9 | Example 10 | Example 11 | Example 12 | Example 13 | Example 14 | Example 15 |
|---|---|---|---|---|---|---|---|---|---|---|
| Paste-like adhesive composition | Metal particles (A) | Metal particles 1 | | 90 | 85 | 90 | 85 | 90 | | |
| | | Metal particles 2 | | | | | | | 85 | |
| | | Metal particles 3 | | | | | | | | 90 |
| | Thermally polymerizable compound (B) | Compound 1 | Monofunctional acryl | | | | | | | |
| | | Compound 2 | Monofunctional acryl | 10 | 15 | | | | 10 | 10 |
| | | Compound 3 | Monofunctional acryl | | | 10 | 15 | | | |
| | | Compound 4 | Monofunctional epoxy | | | | | 8.3 | | |
| | | Compound 5 | Bifunctional epoxy | | | | | | | |
| | | Compound 6 | Bifunctional acryl | | | | | | | |
| | | Compound 7 | Bifunctional acryl | | | | | | | |
| | Curing agent (C) | Curing agent 1 | | 0.05 | | | | | | |
| | | Curing agent 2 | | | | | | 1.7 | | |
| | | Curing agent 3 | | | | | | | | |
| Acetone insoluble fraction (% by weight) | | | | Equal to or lower than 5 | Equal to or lower than 5 | Equal to or lower than 5 | Equal to or lower than 5 | Equal to or lower than 5 | Equal to or lower than 5 | Equal to or lower than 5 |
| Temperature width W [° C.] | | | | 23 | 40 | 33 | 40 | 34 | 23 | 33 |
| Thermal conductivity (thickness direction) [W/mK] | | | | 102 | 120 | 122 | 94 | 72 | 55 | 90 |
| Volume resistivity (surface direction) [$10^{-6}$ Ω · cm] | | | | 5 | 6 | 4 | 4 | 6 | 9 | 5 |
| Dispensing properties | | | | A | A | A | A | A | B | B |
| Evaluation of sintering uniformity | | | | ○ | ○ | ○ | ○ | ○ | ○ | ○ |

TABLE 3

|  |  |  |  | Comparative Example 1 | Comparative Example 2 | Comparative Example 3 | Comparative Example 4 | Comparative Example 5 |
|---|---|---|---|---|---|---|---|---|
| Paste-like adhesive composition | Metal particles (A) | Metal particles 1 | | 90 | 85 | 90 | 85 | 90 |
| | | Metal particles 2 | | | | | | |
| | | Metal particles 3 | | | | | | |
| | Thermally polymerizable compound (B) | Compound 1 | Monofunctional acryl | | | | | |
| | | Compound 2 | Monofunctional acryl | | | | | |
| | | Compound 3 | Monofunctional acryl | | | | | |
| | | Compound 4 | Monofunctional epoxy | | | | | 3.3 |
| | | Compound 5 | Bifunctional epoxy | | | | | 5.6 |
| | | Compound 6 | Bifunctional acryl | 10 | 20 | | | |
| | | Compound 7 | Bifunctional acryl | | | 10 | 20 | |
| | Curing agent (C) | Curing agent 1 | | | | | | |
| | | Curing agent 2 | | | | | | 0.1 |
| | | Curing agent 3 | | | | | | 1.2 |
| Acetone insoluble fraction (% by weight) | | | | Higher than 5 | Higher than 5 | Higher than 5 | Higher than 5 | Higher than 5 |
| Temperature width W [° C.] | | | | 0 | 10 | 5 | 15 | 5 |
| Thermal conductivity (thickness direction) [W/mK] | | | | 10 | 1 | 12 | 2 | 1 |
| Volume resistivity (surface direction) [$10^{-6}$ Ω · cm] | | | | 40 | 90 | 30 | 70 | 400 |
| Dispensing properties | | | | C | B | C | B | C |
| Evaluation of sintering uniformity | | | | x | x | x | x | x |

It was understood that in all of Examples 1 to 15, the results of the evaluation of sintering uniformity and the evaluation of dispensing properties are excellent. Especially, in Examples 1 to 13, the result of the evaluation of dispensing properties was particularly excellent. In contrast, in all of Comparative Examples 1 to 5, the results of the evaluation of sintering uniformity were poor.

Furthermore, from the viewpoint of the thermal conductivity and the electric conductivity, the results obtained from Examples 1 to 15 were better than the results obtained from Comparative Examples 1 to 5. Therefore, it was understood that according to the examples, a die-attach layer is realized in which the thermal conductivity and the electric conductivity are excellently balanced.

The present application claims a priority based on Japanese Patent Application No. 2015-015599 filed on Jan. 29, 2015, the entire disclosure of which is incorporated herein.

The invention claimed is:

1. A paste-like adhesive composition used for forming an adhesive layer in which metal particles (A) are sintered by heat treatment to form a particle coupling structure, comprising:
the metal particles (A); and
a thermally polymerizable compound (B),
wherein the compound (B) is one or more selected from a compound having only one radical polymerizable double bond in the molecule and having no epoxy group, or a compound having only one epoxy group in the molecule and having no radical polymerizable double bond,
wherein the composition does not include a solvent,
wherein when dynamic viscoelasticity of the composition is measured under a condition of a measurement frequency of 1 Hz, within a temperature region of 140° C. to 180° C., the composition has a temperature width of equal to or larger than 10° C. in which a shear modulus of elasticity is equal to or higher than 5,000 Pa and equal to or lower than 100,000 Pa,
wherein an acetone insoluble fraction of a sample, which is obtained by removing the metal particles (A) and then heating the composition under conditions of 180° C. and 2 hours, is equal to or lower than 5% by weight, and
wherein in a case where the composition is formed into a coating film by performing coating, and the coating film is heated to 250° C. from 25° C. at a heating rate of 5° C./min and then heated under conditions of 250° C. and 2 hours, the obtained film has a thermal conductivity of equal to or higher than 15 W/mK in a thickness direction.

2. The paste-like adhesive composition according to claim 1,
wherein in a case where the composition is formed into a coating film by performing coating, and the coating film is heated to 250° C. from 25° C. at a heating rate of 5° C./min and then heated under conditions of 250° C. and 2 hours, the obtained film has a volume resistivity of equal to or lower than $25 \times 10^{-6}$ Ω·cm in a surface direction.

3. The paste-like adhesive composition according to claim 1,
wherein a content of the metal particles (A) with respect to a total amount of the paste-like adhesive composition is equal to or greater than 80% by weight and equal to or less than 95% by weight.

4. The paste-like adhesive composition according to claim 1,
wherein the compound (B) contains a compound having a (meth)acryl group.

5. The paste-like adhesive composition according to claim 1,
wherein the compound (B) contains a (meth)acrylic acid ester.

6. The paste-like adhesive composition according to claim 5,
wherein the (meth)acrylic acid ester contains a compound represented by Formula (1),

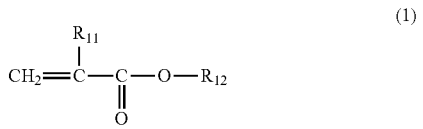

wherein in Formula (1), $R_{11}$ represents hydrogen or a methyl group, and $R_{12}$ represents a monovalent organic group which contains an OH group and has 1 to 20 carbon atoms.

7. The paste-like adhesive composition according to claim 5,
wherein the (meth)acrylic acid ester contains a compound represented by Formula (2),

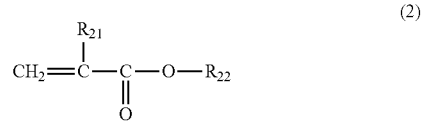

wherein in Formula (2), $R_{21}$ represents hydrogen or a methyl group, and $R_{22}$ represents a monovalent organic group which does not contain an OH group and has 1 to 20 carbon atoms.

8. The paste-like adhesive composition according to claim 5,
wherein the (meth)acrylic acid ester contains the compound represented by Formula (1) and the compound represented by Formula (2),

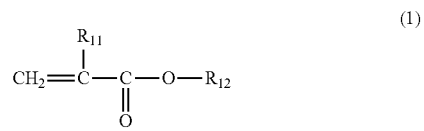

wherein in Formula (1), $R_{11}$ represents hydrogen or a methyl group, and $R_{12}$ represents a monovalent organic group which contains an OH group and has 1 to 20 carbon atoms,

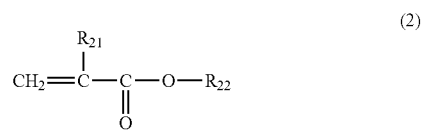

wherein in Formula (2), $R_{21}$ represents hydrogen or a methyl group, and $R_{22}$ represents a monovalent organic group which does not contain an OH group and has 1 to 20 carbon atoms.

9. The paste-like adhesive composition according to claim 1, further comprising:
a compound having a tertiary amino group.

10. The paste-like adhesive composition according to claim 1,
wherein a temperature at 5% weight loss of the composition is equal to or higher than 100° C. and equal to or lower than 180° C.

11. The paste-like adhesive composition according to claim 1,
wherein the metal particles (A) contain one kind of metal or two or more kinds of metals selected from the group consisting of Ag, Au, and Cu.

12. The paste-like adhesive composition according to claim 1,
wherein the metal particles (A) contain spherical particles.

13. The paste-like adhesive composition according to claim 1,
wherein a mean particle size $D_{50}$ of the metal particles (A) is equal to or greater than 0.1 µm.

14. A semiconductor device comprising:
a substrate; and
a semiconductor element mounted on the substrate through an adhesive layer obtained by performing a thermal treatment on the paste-like adhesive composition according to claim 1.

15. The semiconductor device according to claim 14,
wherein a planar shape of the semiconductor element is a rectangle having a side equal to or longer than 5 mm.

16. A method for manufacturing a semiconductor device, comprising:
a step of mounting a semiconductor element on a substrate through the paste-like adhesive composition according to claim 1; and
a step of heating the paste-like adhesive composition.

17. The method for manufacturing a semiconductor device according to claim 16,
wherein the step of heating the paste-like adhesive composition includes a step of heating the paste-like adhesive composition under a temperature condition of lower than 200° C. and a step of heating the paste-like adhesive composition under a temperature condition of equal to or higher than 200° C.

18. The method for manufacturing a semiconductor device according to claim 16,
wherein the step of heating the paste-like adhesive composition is performed in a state of applying a pressure to the paste-like adhesive composition.

19. A method for bonding a heatsink, comprising:
a step of bonding a heatsink to a semiconductor device through the paste-like adhesive composition according to claim 1; and
a step of heating the paste-like adhesive composition.

20. The method for bonding a heatsink according to claim 19,
wherein the step of heating the paste-like adhesive composition includes a step of heating the paste-like adhesive composition under a temperature condition of lower than 200° C. and a step of heating the paste-like adhesive composition under a temperature condition of equal to or higher than 200° C.

21. The method for bonding a heatsink according to claim 19,
wherein the step of heating the paste-like adhesive composition is performed in a state of applying a pressure to the paste-like adhesive composition.

* * * * *